United States Patent

Hanamura

Patent Number: 6,058,599
Date of Patent: May 9, 2000

[54] MOUNTING METHOD AND APPARATUS THEREFORE

[75] Inventor: Naoki Hanamura, Iwata, Japan

[73] Assignee: Yamaha Hatsudoki Kabushiki Kaisha, Iwata, Japan

[21] Appl. No.: 08/972,597

[22] Filed: Nov. 18, 1997

[30] Foreign Application Priority Data

Nov. 18, 1996 [JP] Japan .................................. 8-306909

[51] Int. Cl.$^7$ ............................................... H05K 13/04
[52] U.S. Cl. .............................. 29/740; 29/739; 29/741; 29/759
[58] Field of Search ........................... 29/739, 740, 741, 29/759; 198/349.3, 349.6, 358, 370.01

[56] References Cited

U.S. PATENT DOCUMENTS

| | | | |
|---|---|---|---|
| 4,910,864 | 3/1990 | Elliott | 29/740 |
| 5,002,448 | 3/1991 | Kamijima et al. | 414/225 |
| 5,044,069 | 9/1991 | Assi et al. | 29/740 |
| 5,228,193 | 7/1993 | Yanagawa et al. | 29/832 |
| 5,319,846 | 6/1994 | Takahashi et al. | 29/740 |
| 5,329,692 | 7/1994 | Yasuhiro | |
| 5,651,176 | 7/1997 | Ma et al. | 29/740 |
| 5,740,604 | 4/1998 | Kitamura et al. | 29/832 |
| 5,743,005 | 4/1998 | Nakao et al. | 29/833 |
| 5,796,616 | 8/1998 | Hamuro et al. | 364/468.28 |

FOREIGN PATENT DOCUMENTS 7-162194  6/1995  Japan .
2 183 820  6/1987  United Kingdom .

OTHER PUBLICATIONS

European Search Report dated Feb. 18, 1999.
Patent Abstracts of Japan. vol. 095, No.009, Oct. 31, 1995 & JP 07 162194 A (Matsushita Electric Ind Co Ltd). Jun. 23, 1995.

Primary Examiner—Carl E. Hall
Assistant Examiner—Davide Caputo
Attorney, Agent, or Firm—Knobbe, Martens, Olson & Bear LLP

[57] ABSTRACT

A component mounting apparatus having first and second supply areas juxtaposed to the working area so that components may be selected from either supply area while replacement is being made of spent components at the other supply area.

9 Claims, 5 Drawing Sheets

2

MOUNTING METHOD AND APPARATUS THEREFORE

BACKGROUND OF THE INVENTION

This invention relates to a mounting apparatus and method and more particularly to an improved method and apparatus for mounting components on a substrate with a high rate of production and minimum down time.

There has been proposed a wide variety of devices which are frequently referred to as "surface mounters" that are utilized to position small components on a substrate. These types of apparatus are frequently used in the electronics industry for mounting discrete components, such as chips, capacitors, resistors and the like, on a substrate such as a printed circuit board.

Frequently, these devices are utilized in connection with a conveyor line along which the substrates are conveyed. On at least one side of this conveyor line, there are provided a plurality of feeder stations. Each feeder station feeds a series of components which are to be mounted on the substrate. The components are picked up by a pick-up device and deposited on the substrate. Each feeder station generally includes a feeder tape mechanism in which the components are stored and fed. These feeder stations advance the tape each time a component is taken from the tape by the pick-up head.

Frequently, these devices use multiple mounting heads and handle a wide variety of types of components at a high production rates. One problem with this type of mechanism is that when the components of a certain type become depleted, it is necessary to stop the entire production process so that the appropriate feeder tape can be replaced.

There has been proposed an apparatus, as shown in Japanese published Application 7-162194, wherein an auxiliary component supply unit is disposed adjacent the main component supply unit. When components from the main supply unit become depleted, the pick-up head can utilize the auxiliary component supply unit for continuing mounting. There are, however, at least two significant disadvantages to the construction shown in that publication.

The first is that the auxiliary supply component is disposed at a substantial distance from the working area and, therefore, it is necessary to slow the rate of production when the auxiliary component supply is being utilized.

Second and probably more importantly, the mounter head must still traverse the area where the main supply component is located in order to position the components on the substrate. This means that it is not possible to replace components in the main supply unit while mounting is continued.

It is, therefore, a principal object of this invention to provide an improved method and apparatus for mounting components wherein an auxiliary supply is provided and is located and operated in such a way that mounting can continue at the same rate and that the depleted components from the main supply can be replaced while mounting occurs.

It is a further object of this invention to provide an improved feeder arrangement and location and method for operating a mounting apparatus that permits the aforenoted results to be obtained.

SUMMARY OF THE INVENTION

The features of the invention are adapted to be embodied in a mounting apparatus and method for utilizing it to position components on a substrate. The mounting apparatus comprises a working area wherein the substrates are positioned for mounting components thereon. A first supply area for supplying a plurality of components for mounting on the substrate is positioned in juxtaposition to the working area. A second supply area for supplying components for mounting on a substrate positioned in the working area is also juxtaposed to the working area. Components that are supplied at the second supply area comprise at least a same component as that supplied at the first supply area. A mounting head adapted to pick up and deposit components is provided. This mounting head is mounted for movement between both the first and second supply areas and the working area for picking up components from either supply area and mounting them on a substrate in the working area.

In accordance with an apparatus for performing a first feature of the invention, the first and second supply areas are disposed at substantially the same distance to the working area.

In accordance with a method for practicing this feature of the invention, the first and second supply areas are positioned so as to be substantially equidistant from the mounting area.

In accordance with an apparatus for performing another feature of the invention, the first and second supply areas are positioned relative to the working area so that when components are being picked up from one supply area and deposited at the working area, components from the other supply area can be replaced.

In accordance with a method for practicing the invention, the first and second supply areas are positioned so that components can be picked up from either supply area and deposited at th'se's, working area without interfering with access to the other supply area for replacing components therein.

DETAILED DESCRIPTION OF THE PREFERRED EMBODIMENT OF THE INVENTION

Figure 1:
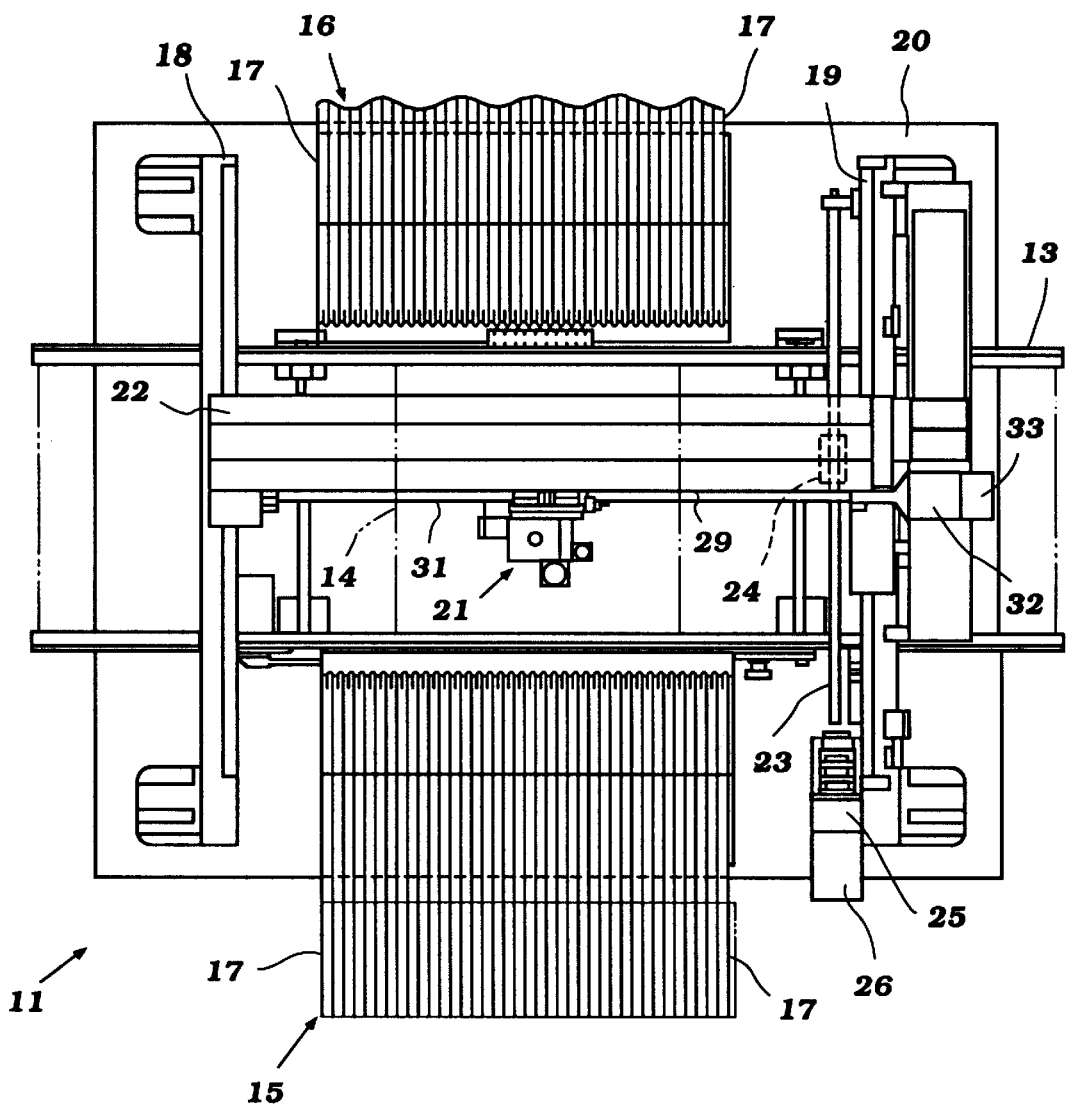
FIG. 1 is a top plan view of a mounting apparatus constructed and operated in accordance with an embodiment of the invention.
Figure 2:
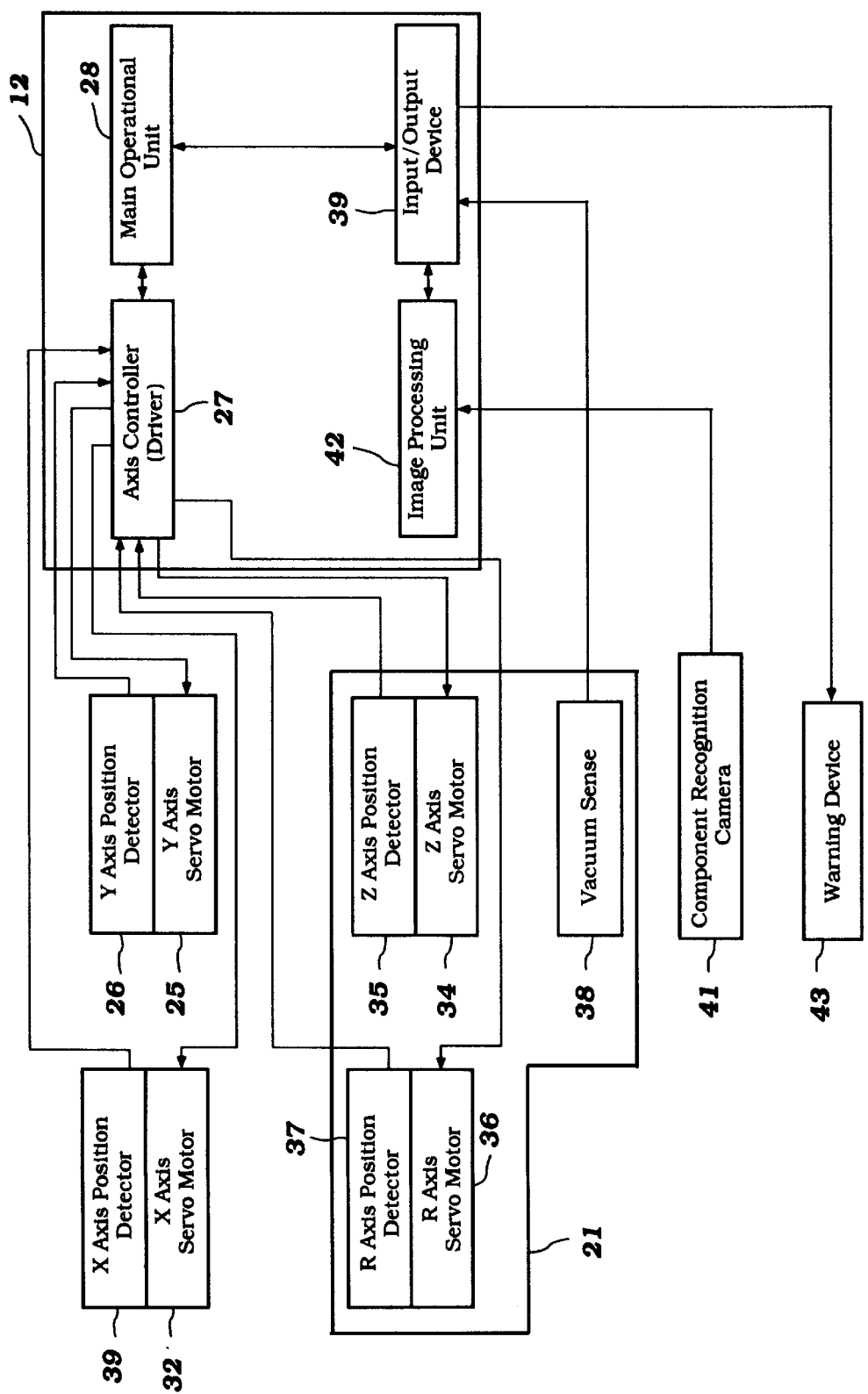
FIG. 2 is a diagrammatic view showing the relationship of the various components of the mounting apparatus.

Referring now in detail to the drawings, a component mounting apparatus constructed in accordance with an embodiment of the invention is depicted in FIG. 1 and is identified generally by the reference numeral 11. This mounting apparatus is controlled by a control unit, indicated generally by the reference numeral 12, and shown only schematically in FIG. 2. FIG. 2 should be referred to in connection with the description of FIG. 1, because FIG. 2 shows the interrelationship between the various components illustrated in detail in FIG. 1 and their interrelationship with the control unit 12.

The mounting apparatus 11 is comprised of a main conveyor 13 which is comprised of a pair of spaced-apart guide rails and along with substrate, such as printed circuit boards, shown in phantom and indicated by the reference numeral 14, are moved.

There is defined generally a work area that is disposed between the rails of the conveyor 13 and specifically between first, main and second, auxiliary component supply areas 15 and 16, which are disposed on opposite sides of the conveyor 13 and which have substantially the same length. Each component supply area 15 and 16 is comprised of a plurality of individual component feeders, indicated by the reference numeral 17. These feeders may be of the tape-feed type, wherein a feed tape is sequentially advanced as components are removed from it. This feed tape has individual pockets in which small discrete components, such as resistors, capacitors, chips or the like are stored.

As already noted, area 15 may be considered to be the main feeder area, while area 16 may be considered to be an auxiliary feeder area. Preferably, at least some of the components supplied by the main area 15 are also supplied by the auxiliary area 16. These components which are duplicated are primarily those which are utilized in the higher volumes.

Alternatively, the areas 15 and 16 may be exact mirror images of each other. That is, the area 15 may have feeders 17 that supply exactly the same components as the feeders 17 of the area 16. How these feeders and components are arranged and vary at will, depending upon the particular types of mountings that are being performed.

The aforenoted work area is further defined by a pair of transversely extending guide rails 18 and 19 that are mounted on a table 20 across which the conveyor 13 extends. The conveyor 13 extends generally in the X-axis direction, while the guide rails 18 and 19 extend in the Y-axis direction. Components such as the substrates 14 therefore travel in the X-axis direction along the conveyor 13.

A mounting head assembly, indicated generally by the reference numeral 21, is supported on a carriage 22 which is, in turn, supported for movement along the guide rails 18 and 19 in the Y-axis direction.

The carriage 22 is moved in the Y-axis direction by means of a Y-axis feed screw 23 that is journaled adjacent the guide rail 19 in a suitable manner. This feed screw 23 cooperates with a recirculating ball nut 24 that is carried by the carriage 22 for translational movement of the carriage 22 along the guide rails 18 and 19 in the Y-axis direction.

A Y-axis servo motor 25 is in driving arrangement with the feed screw 23 and effects its rotation so as to provide Y-axis positioning of the mounter head 21. A Y-axis encoder 26 is associated with the Y-axis servo motor 25 to provide an output signal to the control unit 12 that is indicative of the Y-axis position of the mounting head 21.

The Y-axis position detector 26 supplies its information to an axis controller driver, shown schematically at 27 in FIG. 2, and which forms a portion of the main control unit 12. This axis controller or driver 27 also outputs control signals to the Y-axis servo motor 25 to effect its movement to the desired Y-axis position in accordance with a suitable control program. The Y-axis controller is controlled by a main operational unit, indicated schematically at 28 in FIG. 2.

The mounting head 21 is supported for movement relative to the carriage 22 in an X-axis direction by means of a guide rail 29 formed on one side of the carriage 22. A feed screw 31 cooperates with a recirculating ball nut (not shown) carried by the mounting head 21 for moving the mounting head 21 in the X-axis direction.

The feed screw 31 is driven by an X-axis servo motor 32 which is also operated by the axis controller or driver 27, as shown schematically in FIG. 2. An encoder 33 is associated with the X-axis servo motor 32 so as to provide the control unit 12, and specifically the axis controller 27, with information as to the X-axis position of the mounting head 21.

Referring new primarily to FIG. 2, the mounting head 21 includes one or more pick-up devices which are preferably of the vacuum type and which are adapted to pick up the small components by exerting a vacuum on a contact surface thereof. The air pressure then holds the component into gripping engagement with the mounting head pick-up nozzle, as is well known in this art. Since these constructions are well known and any type may be utilized to practice the invention, the specific mounting head is not illustrated. As is also known in the art, a plurality of individual pick-up nozzles, each controlled separately or simultaneously, may be carried by the mounting head 21.

As may be seen in FIG. 2, each pick-up nozzle is mounted for vertical movement in the Z-axis. This movement is controlled by a Z-axis servo motor, indicated schematically at 34. Like the other axis driver servo motors, an encoder 35 is associated with the Z-axis servo motor 34 to provide information to the axis controller 27 so that the accurate position of the pick-up nozzle can be controlled.

Basically, the movement in the Z-axis direction is utilized to pick up components from the feeders 17 and elevate them during the travel of the mounting head 21 from the appropriate feeder stations 15 or 16 to the working area where the substrate 14 is positioned. The mounting nozzle is then lowered so as to deposit the component on the substrate.

In addition to the vertical, Z-axis directional movement of the mounting nozzles, each mounting nozzle is also rotatable about an R-axis which is coincident with the X-axis. This rotational movement is achieved by a known type of R-axis servo motor, indicated schematically at 36 in FIG. 2. Again, an R-axis position detector 37 is associated with the servo motor 36 so as to output to the axis controller 27 an indication of the rotational position of the pick-up nozzle and the component held thereby.

Also associated with the pick-up nozzles carried by the mounting head 21 is a vacuum sensor, indicated schematically at 38. As will be described later, the vacuum sensor outputs a signal to an input/output device 39 of the main control unit 12. By sensing the vacuum, it can be determined if a component has been picked up by the pick-up nozzle. That is, if a high vacuum (low absolute pressure) is sensed by the sensor 38, this indicates that a component is adhered to or gripped by the pick-up nozzle. If, however, the pressure is high and the vacuum is low, this will be an indication that the component has not been picked up or is not held securely.

Continuing to refer primarily to FIG. 2, there is provided in a fixed location on the table 20 in proximity to the feeder stations 15 and 16, a component recognition camera, indicated generally by the reference numeral 41. This, or any other suitable device, is utilized to determine the positioning the component as actually held by the pick-up nozzle so that appropriate corrections can be made to ensure that the component is positioned at the proper location and orientation on the printed circuit board or substrate 14.

The component recognition camera 41 or other sensing device outputs its information to an image processing unit 42. The image processing unit 42, in turn, inputs its information to the controller through the input/output device 39.

The input/output device 39 also can output a warning signal to a warning device, indicated generally by the reference numeral 43, and which may be of any form, such as a buzzer, flashing light or combination thereof. The situations in which the warnings are given will be described shortly.

The basic operation of the mounting unit 11 in picking up components from the feeder stations 15 and/or 16 and depositing them in the work area on a substrate 14 can follow any type of procedure that is known in the art. That is, the control unit 12 is programmed so as to recognize the substrate that is presented, determine what components should be mounted on, and mounts them.

The invent on, as should be readily apparent from the foregoing description, deals in how the system operates to verify that a component will be available at the appropriate feeder station and what protective action is taken in the event there is not a component at the main feeding station 15 for positioning. Thus, where any details of the construction or operation of the device dealing with the conventional mounting phase is not illustrated or described, reference may be had to any type of prior art construction for constructions that can be utilized to practice the invention.

Figure 3:
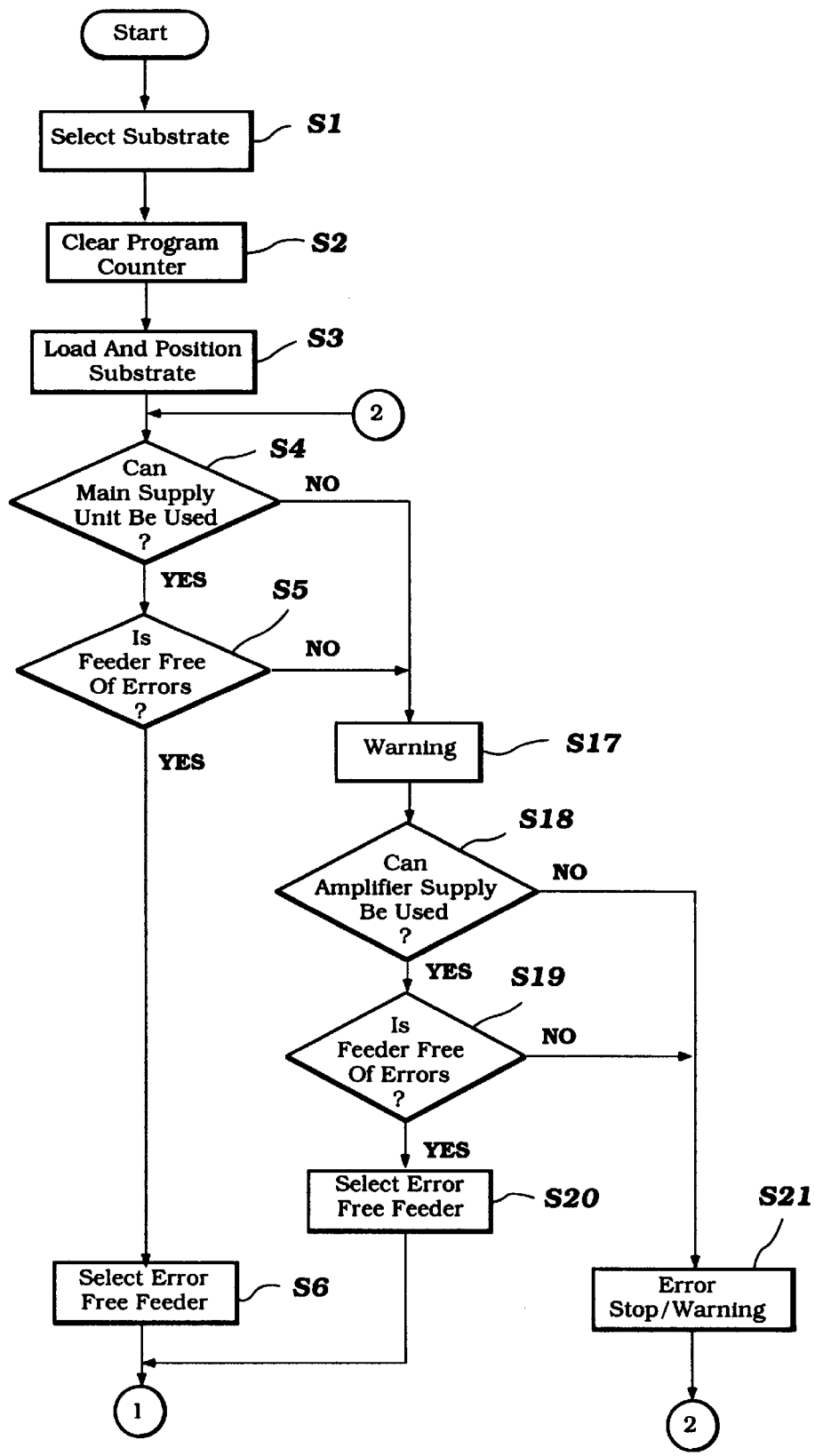
FIG. 3 is a block diagram showing a first portion of the control routine of the apparatus in accordance with an embodiment of the invention.
Figure 4:
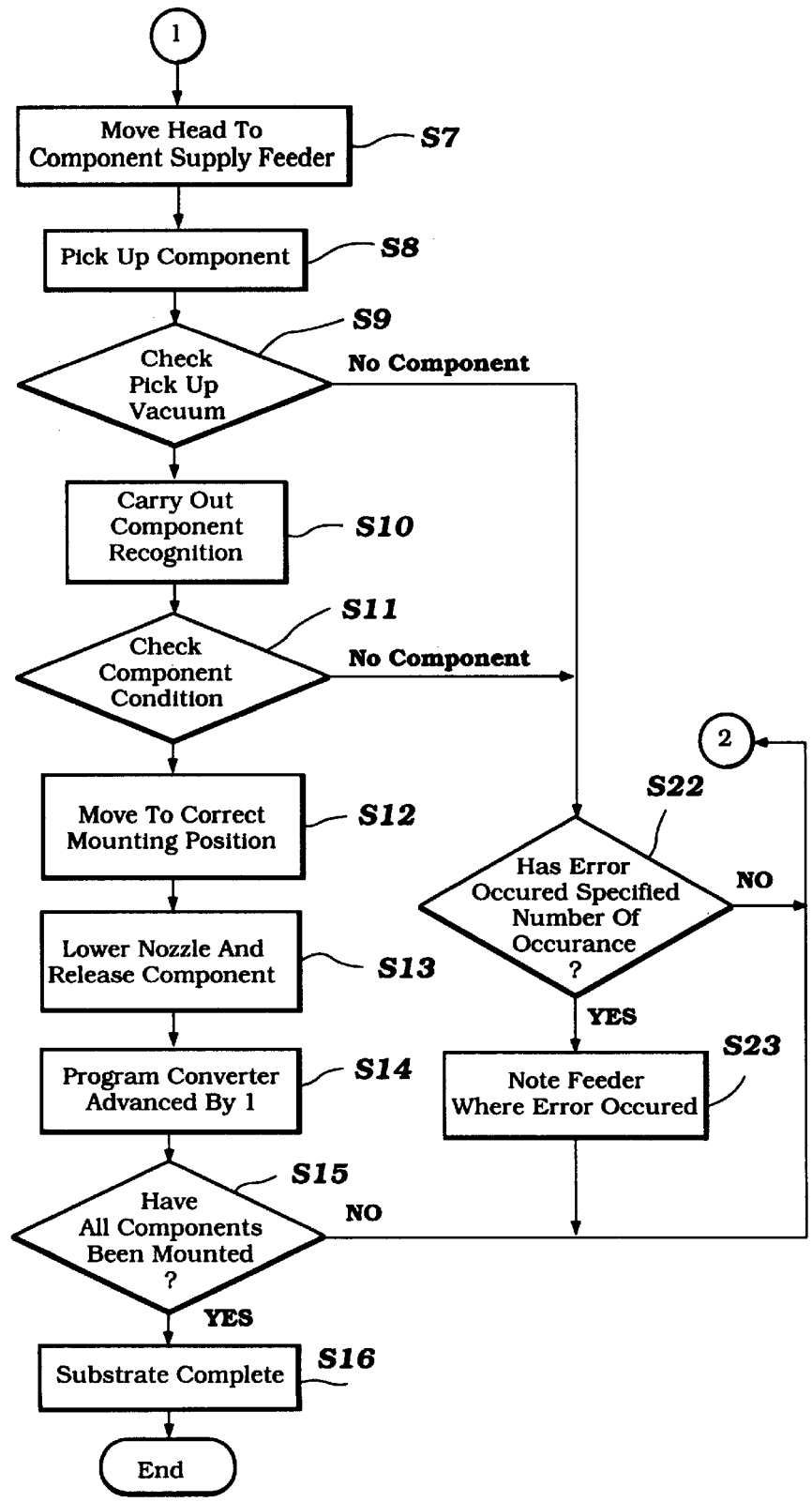
FIG. 4 is a block diagram showing the remaining portion of the control routine.

The mounting procedure will now be described by reference to FIGS. 3 and 4, beginning first at FIG. 3. Referring first to FIG. 3, when the program starts at the step S1, a substrate is selected for mounting. The program then at the step S2 clears the program counters. Then, at the step S3, the appropriate substrate is loaded onto the conveyor 13 and positioned at the work station between the main and auxiliary component feeder areas 15 and 16.

The program then moves to the step S4 wherein a determination is made as to whether the component to be installed or deposited is available at the main feeder area 15. This decision is made by determining whether or not the appropriate feeder or feeders containing this component are available at the area 15.

As will become apparent as the description proceeds, it is possible to continue the mounting operation if one or more feeders 17 are removed for servicing through adding additional tapes or for other reasons. In order to determine if the feeder is available and the main supply area 15 can be utilized, switches associated with each of the feeders 17 are checked.

If a feeder is removed, then the switch will indicate this, and the decision No will be reached at the step S4. However, assuming that this is not the case, the program then moves to the step S5.

At the step S5, it is determined whether or not the particular feeder containing the component is available. The control unit 12 is configured so as to select the appropriate feeder 17 that contains the component next to be positioned. If more than one feeder contains the same component in the main component supply area 15, the control unit 12 will check each feeder to make sure that at least one feeder has the component and is available.

If such a feeder is found present in the main supply area 15, then the program proceeds. Thus, at the step S6, the program moves to select an error-free feeder from those in the main area 15. Then the program moves to the step S7, shown in FIG. 4.

At the step S7, the axis controller 27 outputs signals to the various servo motors to actuate the mounting head 21 and carriage assembly 22 to place the pick-up nozzle in registry with the appropriate feeder 17 of the main component supply area 15.

The program then moves to the step S8 so as to pick up the component from the feeder. This is done by lowering the pick-up nozzle to registry with the pocket in the appropriate tape and exerting a vacuum nozzle on the component.

The program then moves to the step S9 to check if the component has been accurately picked up by sensing the vacuum signal. As has been noted, if the vacuum does not increase, i.e., absolute pressure decrease, then it is assumed that no component has been picked up, and the program skips ahead.

Assuming at the step S9 it has been determined that a component is being held by the nozzle because there is a high vacuum sensed by the sensor 38, the program moves to the step S10.

At the step S10, the mounting apparatus, and specifically the mounter head 21, is positioned in registry with the component recognition camera 41. At this area, the image processing unit 42 compares the image with the predetermined or preset image for the desired component. This can be done by any known recognition process.

Then, at the step S11, the determination is made to see if the proper component is in position. If it is not, the program jumps ahead, and it is assumed that there is no component actually picked up. If, however, at the step S11, the component condition is read, then the program moves ahead to the step S12.

At the step S12, the axis controller unit 23 outputs its signals to the various servo motors to advance the mounting head 21 to the appropriate position over the substrate 14 for positioning of the component. At the same time, corrections in the orientation of the component are also made based upon the information derived at the step S10. Again, this type of technique is well known.

Then, at the step S13, the Z-axis servo motor 34 is energized so as to lower the component into position on the substrate, and the vacuum is decreased. In other words, the component is then mounted on the substrate 14.

The program then moves to the step S14 so as to indicate in the program counter that the component has been mounted. This is done by adding the unit 1 to the counter.

The program then moves to the step S15 to determine if all of the components required for the particular substrate have been mounted. If not, the program repeats.

If, however at the step S15 it is determined that all components for the substrate have been mounted. The program moves to the step S16.

At the step S16, the conveyor 13 is energized so as to remove the substrate 14 from the work area. The program then ends.

Referring again to FIG. 3, if at either the steps S4 or S5 it is determined that the component to be loaded is not available at the main component feed area 15, then the program moves to the step S17. At this step, the warning provided by the warning device 43 is set. This gives the operator information as to the component which is lacking and which should be made available again by replacing the appropriate feeder 17 in the main component supply area 15. This replacement is done in a normal known manner.

The program then moves to the step S18 to determine if the component is available at the auxiliary component feeder area 16. The program then moves through a series of steps which are basically the same steps as the steps S4, S5 and S6, in that sequence.

Thus, at the step S18, it is determined if the auxiliary supply area 16 can be utilized by determining if the feeder 17 having the necessary component is available. Again, this is done by determining if the appropriate feeder switch indicates the presence of the feeder.

If at the step S18 it is indicated that the auxiliary feeder supply is available, then the program moves to the step S19 to confirm that the appropriate feeder 17 at the area 16 is available. Assuming, that there is a feeder available having the component, the program then moves to the step S20 so as to select the error-free feeder. The program then proceeds to the step S7 so as to carry out the steps S7 through S16, in the manner previously described.

If, however, it any of the steps S18 or S19 it is determined that a component is not available at the auxiliary area 16, then the program moves to the step S21 so as to provide a further warning and stop the mounting procedures, since no component is available at any area, either of the areas 15 or 16.

Assuming that a component is available, then the program moves on, as has been noted, to the steps S7 through S16. If, however, at the steps S9 or S11 it is determined that a component has not been picked up even from the alternate source, then the program moves to the step S22. There may be a situation where it is desired to permit several attempts to pick up the same component, and it may be only an abnormality that a component is not available in one location. Thus, the program then will proceed to the step S22 to count the number of errors which have been measured and determine whether they are equal to a present number. If they are not, the program repeats. If they are, however, then the program moves to the step S23 to store the information in the memory, the feeder location where the error has occurred, and provide this indication to the operator so that the system can be serviced.

Because the feeder areas 15 and 16 are on opposite sides of the work area, regardless of which feeder area is chosen to mount the component, the mounting time will be substantially the same, and thus the system need not make other alterations in the mounting program. Also, because of this opposite location, it is possible to service the feeder areas 15 or 16 where components are missing without necessitating stopping of the mounting procedure. Thus, the productivity of the system can be significantly improved because of the inclusion of this feature.

Figure 5:
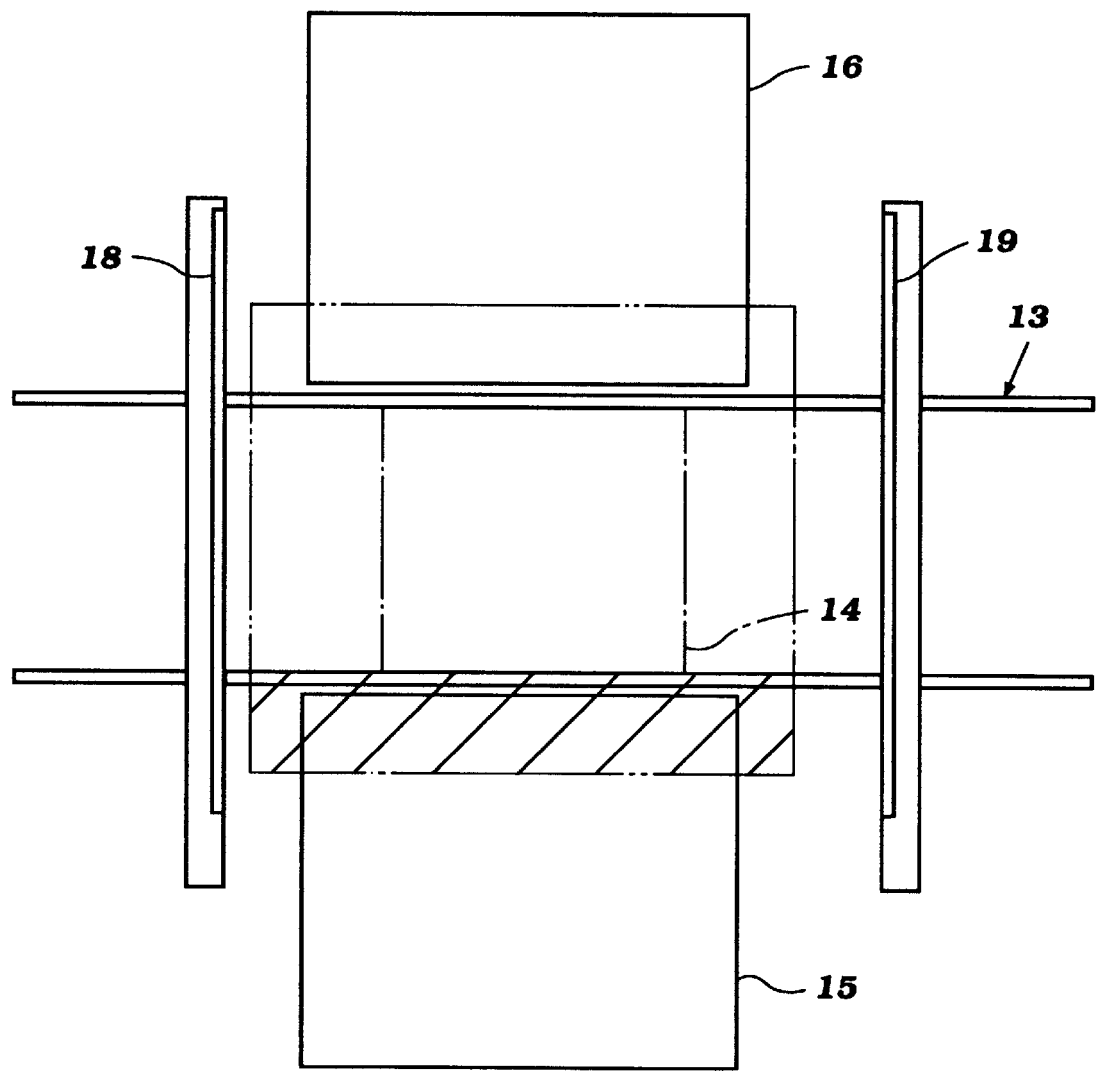
FIG. 5 is a further enlarged top plan view, looking in the same direction as FIG. 1, and shows another embodiment of the invention.

Although the system operates so as to ensure that the mounting head does not encroach on the main supply area when components are being selected from the auxiliary supply side 16 or vice versa, the system may also be incorporated with limit stops that will preclude the mounting head from moving into an area in proximity to the supply area not being utilized. FIG. 5 shows such an arrangement wherein when components are being selected from the auxiliary supply side 16, the mounting unit is controlled so that it cannot move into the shaded area over the main supply side 15 so that it can be serviced. This can be done without interfering with the operation of the device but will offer further assurance to the operator that he will not be injured if he replaced feeders in the side 15.

Also, it should be noted that the system may be provided with a manual operation switch that permits the operator to make selections manually in the event a warning signal has been initiated.

In the embodiments illustrated, the component feeding areas 15 and 16 have been positioned on opposite sides of the conveyor 13. They may be both positioned on the same side, however, at different vertical heights, for example one above and one below the conveyor 13 so long as each can be accessed by the head 21 without obstructing access to the other for servicing of the depleted feeder 17.

Of course, the foregoing description is that of preferred embodiments of the invention. Various changes and modifications may be made without departing from the spirit and scope of the invention, as defined by the appended claims.

I claim:

1. A mounting apparatus for positioning components on a substrate, said mounting apparatus comprising a working area wherein substrates are positioned for mounting components thereon, a first supply area for supplying a plurality of components for mounting on substrates positioned in said working area and juxtaposed to said working area, a second supply area for supplying components for mounting on a substrate positioned in said working area and juxtaposed to said working area, components supplied at said second component supply area comprising at least one of the same components supplied at said first supply area, a mounting head adapted to pick up and deposit components, means for supporting and operating said mounting head for movement between each of said first and said second supply areas and said working area for picking up components and mounting them on a substrate in said working area, said supply areas and said mounting head and said means for supporting and operating said mounting head being positioned so that either of said supply areas can be accessed for servicing when said mounting head is picking up components from the other of said supply areas and means for providing a warning when the component is not available at one of the supply areas and is being selected from the other supply area so that the depleted supply area can be serviced.

2. A mounting apparatus as set forth in claim 1, wherein the first and second supply areas are disposed at substantially the same distance from the working area.

3. A mounting apparatus as set forth in claim 2, further including a conveyor for supplying components to the working area and wherein the supply areas are disposed on the side of the conveyor.

4. A mounting apparatus as set forth in claim 3, wherein the supply areas are disposed on opposite sides of the conveyor and adjacent the working area.

5. A mounting apparatus for positioning components on a substrate, said mounting apparatus comprising a working area wherein substrates are positioned for mounting components thereon, a first supply area for supplying a plurality of components for mounting on substrates positioned in said working area and juxtaposed to said working area, a second supply area for supplying components for mounting on a substrate positioned in said working area and juxtaposed to said working area, components supplied at said second component supply area comprising at least one of the same components supplied at said first supply area, a mounting head adapted to pick up and deposit components, means for supporting and operating said mounting head for movement between each of said first and said second supply areas and said working area for picking up components and mounting them on a substrate in said working area, said supply areas being positioned so that either of said supply areas can be accessed for servicing when the mounting head is picking up components from the other of the supply areas, and means for preventing movement of said mounting head into one of said supply are as when a component that has been available at both of said supply are as is not present at the one supply area while permitting continued movement of said mounting head into the other of said supply areas.

6. A mounting apparatus as set forth in claim 5, wherein the first and second supply areas are disposed at substantially the same distance from the working area.

7. A mounting apparatus as set forth in claim 6, further including a conveyor for supplying components to the working area and wherein the supply areas are disposed on the side of the conveyor.

8. A mounting apparatus as set forth in claim 7, wherein the supply areas are disposed on opposite sides of the conveyor and adjacent the working area.

9. A mounting apparatus as set forth in claim 5, further including means for providing a warning when the component is not available at one of the supply areas and is being selected from the other supply area so that the depleted supply area can be serviced.

* * * * *

UNITED STATES PATENT AND TRADEMARK OFFICE
CERTIFICATE OF CORRECTION

PATENT NO : 6058599
DATED : May 9, 2000
INVENTOR(S) : Naoki Hanamura It is certified that error appears in the above-identified patent and that said Letters Patent is hereby corrected as shown below:

Column 2, line 33, delete "th'se's," and insert --the--.

Column 4, line 9, delete "new" and insert --now--.

Column 5, line 14, delete "invent on" and insert --invention--.

Column 6, line 45, after "mounted", delete ". The" and insert --, the--.

Column 7, line 12, delete "it" and insert -- at--.

Column 7, line 28, delete "present" and insert --preset--.

Column 8, Claim 5, line 60, delete "are as" and insert --areas--; same line, delete "has" and insert --had--.

Column 8, Claim 5, line 61, delete "are as" and insert -- areas--.

Signed and Sealed this

Twenty-second Day of May, 2001

*Attest:*

NICHOLAS P. GODICI

*Attesting Officer*   Acting Director of the United States Patent and Trademark Office